US010157980B1

(12) United States Patent
Lo et al.

(10) Patent No.: US 10,157,980 B1
(45) Date of Patent: Dec. 18, 2018

(54) SEMICONDUCTOR DEVICE HAVING DIODE DEVICES WITH DIFFERENT BARRIER HEIGHTS AND MANUFACTURING METHOD THEREOF

(71) Applicant: TAIWAN SEMICONDUCTOR MANUFACTURING COMPANY LTD., Hsinchu (TW)

(72) Inventors: Wen-Shun Lo, Hsinchu County (TW); Yu-Chi Chang, Kaohsiung (TW); Felix Ying-Kit Tsui, Cupertino, CA (US)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/793,439

(22) Filed: Oct. 25, 2017

(51) Int. Cl.
| | | |
|---|---|---|
| H01L 21/426 | (2006.01) |
| H01L 29/06 | (2006.01) |
| H01L 21/285 | (2006.01) |
| H01L 29/66 | (2006.01) |
| H01L 29/872 | (2006.01) |
| H01L 21/266 | (2006.01) |
| H01L 27/08 | (2006.01) |

(52) U.S. Cl.
CPC ........ *H01L 29/0619* (2013.01); *H01L 21/266* (2013.01); *H01L 21/28537* (2013.01); *H01L 21/426* (2013.01); *H01L 27/0814* (2013.01); *H01L 29/66143* (2013.01); *H01L 29/872* (2013.01)

(58) Field of Classification Search
CPC ............. H01L 21/26513; H01L 21/266; H01L 21/28537; H01L 21/426; H01L 27/0814; H01L 29/66143; H01L 29/872
See application file for complete search history.

(56) References Cited

U.S. PATENT DOCUMENTS

| | | | |
|---|---|---|---|
| 7,893,442 B2 | 2/2011 | Shim et al. | |
| 9,318,331 B2 * | 4/2016 | Bour | ................ H01L 21/26546 |
| 2003/0020133 A1 * | 1/2003 | Dahlqvist | ........... H01L 27/0814 |
| | | | 257/471 |
| 2006/0237813 A1 * | 10/2006 | Hshieh | ................. H01L 29/402 |
| | | | 257/475 |

(Continued)

FOREIGN PATENT DOCUMENTS

TW    I597838 B    9/2017

OTHER PUBLICATIONS

Office Action dated Sep. 14, 2018 issued by the Taiwan Intellectual Property Office (TIPO) for counterpart application No. 107111532.

*Primary Examiner* — Stephen W Smoot
(74) *Attorney, Agent, or Firm* — WPAT, P.C., Intellectual Property Attorneys; Anthony King

(57) ABSTRACT

The present disclosure provides a method of manufacturing a Schottky diode. A substrate is provided. A first well region of a first conductive type is formed in the substrate. A first ion implantation of a second conductive type is performed on a first portion of the first well region while keeping a second portion of the first well region from being implanted. A first doped region is formed by heating the substrate to cause dopant diffusion between the first portion and the second portion. A metal-containing layer is formed on the first doped region to obtain a Schottky barrier interface.

20 Claims, 16 Drawing Sheets

(56) References Cited

U.S. PATENT DOCUMENTS

| | | | |
|---|---|---|---|
| 2007/0293028 A1* | 12/2007 | Wu | H01L 21/26513 438/570 |
| 2009/0224354 A1* | 9/2009 | Konstantinov | H01L 29/6606 257/475 |
| 2015/0001667 A1* | 1/2015 | Matsuzaki | H01L 29/872 257/471 |
| 2015/0206941 A1* | 7/2015 | Uehigashi | H01L 29/872 257/77 |
| 2017/0125608 A1 | 5/2017 | Lu et al. | |

* cited by examiner

US 10,157,980 B1

SEMICONDUCTOR DEVICE HAVING DIODE DEVICES WITH DIFFERENT BARRIER HEIGHTS AND MANUFACTURING METHOD THEREOF

BACKGROUND

Schottky barrier diodes, or simply Schottky diodes, are widely used in modern semiconductor devices. The Schottky diode enjoys lots of advantages such as a low forward voltage drop and a high switching speed. The Schottky diode is particular useful in radio-frequency applications, for example, energy harvest devices. Most of the time a semiconductor device may require a few Schottky diodes with different specifications for performing different tasks or fulfilling different performance requirements. Fabricating processes for such similar yet different Schottky diodes may be time-consuming and costly. Accordingly, it is desirable to improve existing manufacturing procedures of the Schottky diodes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. Specifically, the dimensions of the various features may be arbitrarily increased or reduced for clarity of discussion.

DETAILED DESCRIPTION

Figure 1A:
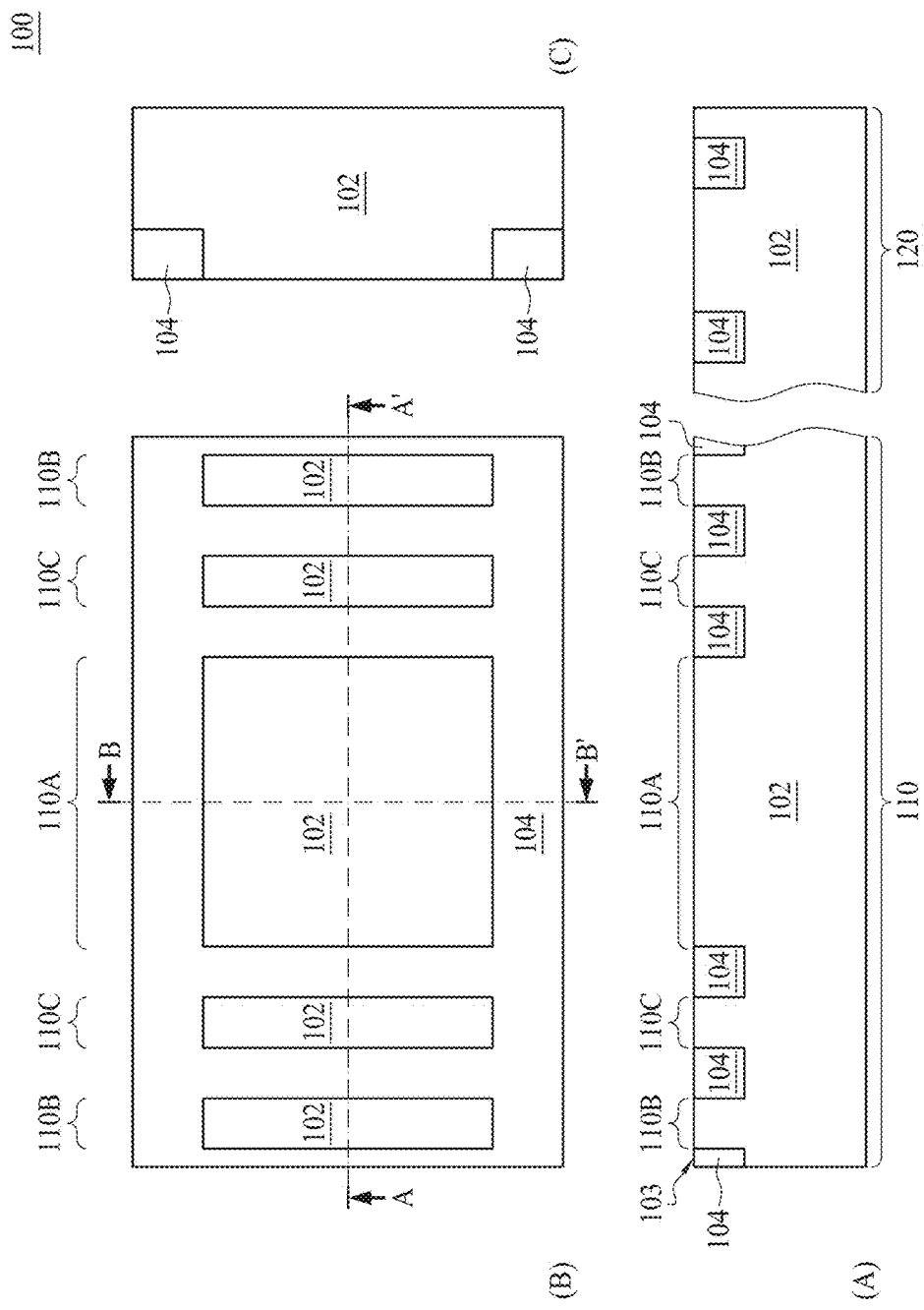
FIGS. 1A through 1L are top views and cross-sectional views of intermediate stages of a method of manufacturing a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath." "below," "lower," "above." "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides structures and manufacturing operations of diode, specifically a Schottky barrier diode device, according to various embodiments. A diode with a lower barrier height may provide a higher forward conduction current while also resulting in a higher reverse current. A diode with a higher forward conduction current may be desirable in many applications, but the accompanying higher reverse current may hinder its popularity. As a result, diodes with different performance specifications (e.g., barrier heights) in a same semiconductor chip are commonly seen in modern electronic applications. Existing methods call for individual lithography operations to achieve different barrier heights for different diode devices. In the present disclosure a manufacturing operation is proposed to produce a variety of diode devices on a same semiconductor wafer or chip. Different diodes with varying barrier heights are manufactured during a same lithography operation and using a same photomask, and the lithography operations repeated according to the different barrier heights required for the diodes are prevented accordingly. Both the manufacturing cost and production through put are improved effectively.

FIGS. 1A through 1L are top views and cross-sectional views of intermediate stages of a method of manufacturing a semiconductor device 100, in accordance with some embodiments. Each figure contains at least one of subplots (A), (B) and (C) where the subplot (A) shows a cross-sectional view of the semiconductor device 100 across a diode region 110 and a transistor region 120, and subplots (B) and (C) show a top view and a cross-sectional view of the diode region 10, respectively. The subplots (A) and (C) are taken along sectional lines AA' and BB', respectively, of subplot (B), in which subplot (A) further includes the aforesaid transistor region 120 not shown in subplot (B). In some of the subsequent figures, subplot (C) is omitted for simplicity.

Referring to FIG. 1A, a substrate 102 is provided or received. The substrate 102 includes a semiconductor material such as silicon, germanium, silicon germanium, silicon carbide, gallium arsenide, or the like. Alternatively, the substrate 102 includes a compound semiconductor including gallium arsenic, gallium phosphide, indium phosphide, indium arsenide, indium antimonide, or combinations thereof. In other alternatives, the substrate 102 may include a doped epitaxial layer, a gradient semiconductor layer, and/or a semiconductor layer overlaying another semiconductor layer of a different type, such as a silicon layer on a silicon germanium layer. The substrate 102 may be doped with an N-type dopant, such as arsenic, phosphor, or the like, or may be doped with a P-type dopant, such as boron or the like.

Next, isolation structures 104 are formed on the substrate 102. The isolation structures 104 are formed in both the diode region 110 and the transistor region 120. As shown in the subplot (A), the diode region 110 is partitioned into several zones by the isolation structures 104, i.e., an anode zone 110A, two bulk zones 110B, and two cathode zones 110C. The anode zone 110A, bulk zones 110B, and cathode zones 110C are separated and surrounded by the isolation structures 104 near an upper surface 103 of the semiconductor device 100. The isolation structures 104 may be shallow trench isolation (STI) or local oxidation of silicon (LOCOS). As an exemplary operation for manufacturing the isolation structures 104, several trenches are formed initially by an etching operation, such as a dry etching, a wet etching, a reactive ion etching (RIE) operation, or the like. Next, isolation materials are filled into the trenches to form the isolation structures 104. The isolation materials may be formed of electrically insulating materials, such as dielectric materials. In some embodiments, the isolation structures 104 are formed of oxide, nitride, oxynitride, silicon dioxide, nitrogen-bearing oxide, nitrogen-doped oxide, silicon oxynitride, polymer, or the like. The dielectric material may be formed using a suitable process such as chemical vapor deposition (CVD), physical vapor deposition (PVD), atomic layer deposition (ALD), thermal oxidation, UV-ozone oxidation, or combinations thereof. In some embodiments, a planarization operation, such as grinding or chemical mechanical planarization (CMP) processes, may be used to remove excess materials of the isolation structures 104 and level the top surfaces of the isolation structures 104 with the substrate 102.

Figure 1B:
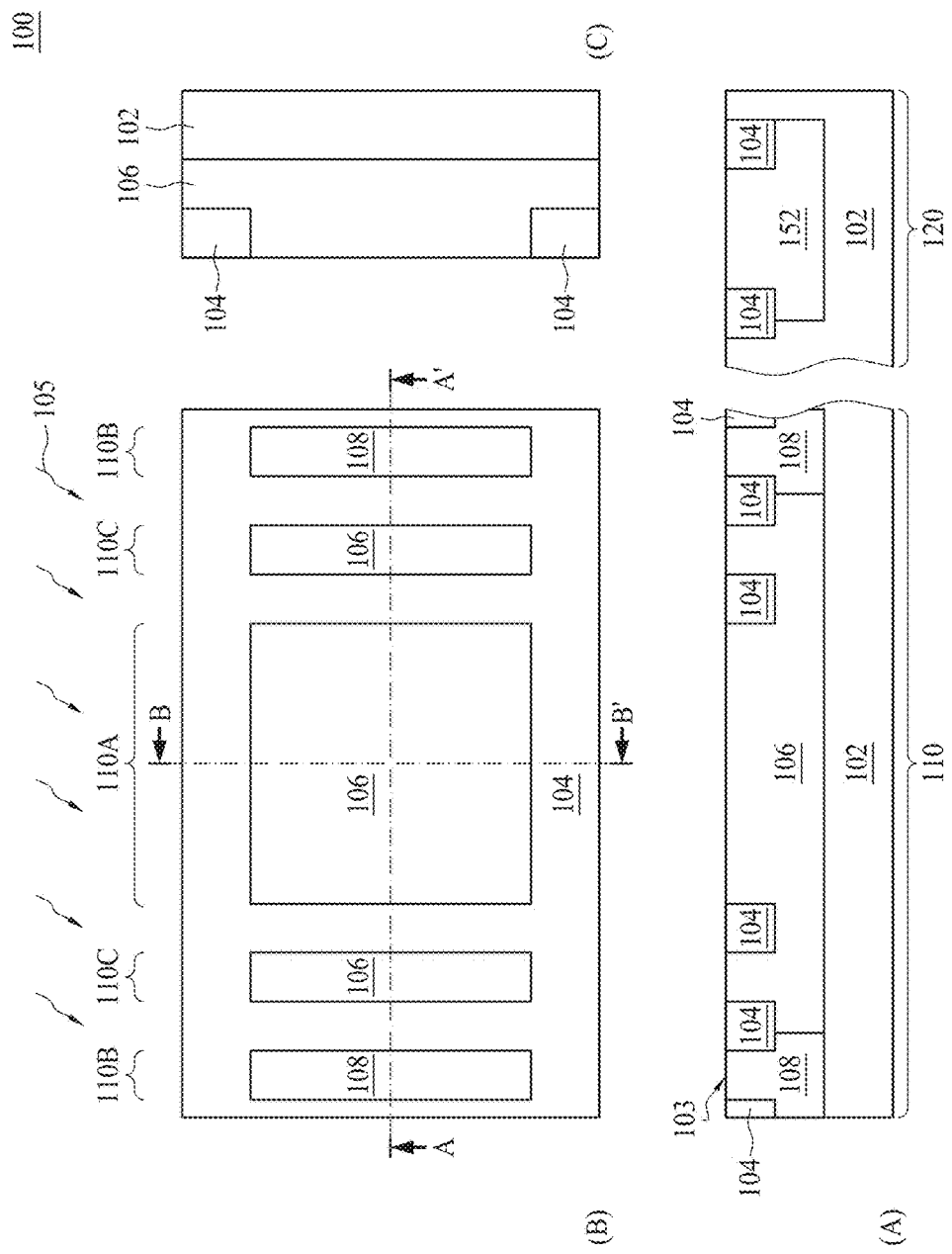

Referring to FIG. 1B, well regions 106 and 108 are formed in the diode region 110. Further, a well region 152 is formed in the transistor region 120. In an embodiment, the well region 106 covers the anode zone 110A, the cathode zones 110C, and the region under the isolation structure 104. The well region 108 covers the bulk zone 110B. Similarly, the well region 152 is formed in the transistor region 120. The well regions 106, 108 and 152 may be formed by implanting dopants by one or more ion implantation operations 105. Ions or dopants are implanted to desired portions of the upper surface 103 of the substrate 102. In some embodiments, a mask may be used to permit only the desired portions to receive dopants. In the present embodiments, the well regions 106, 108 and 152 are adjacent to the isolation structures 104. In some embodiments, the well regions 106, 108 and 152 are surrounded by the isolation structures 104 when viewed from above, as shown in the subplot (A). In the depicted embodiment, adjacent well regions 106 and 108 are separated near the upper surface 103 by at least one isolation structure 104 and abut each other at a level lower than that of the isolation structures 104.

Figure 1C:
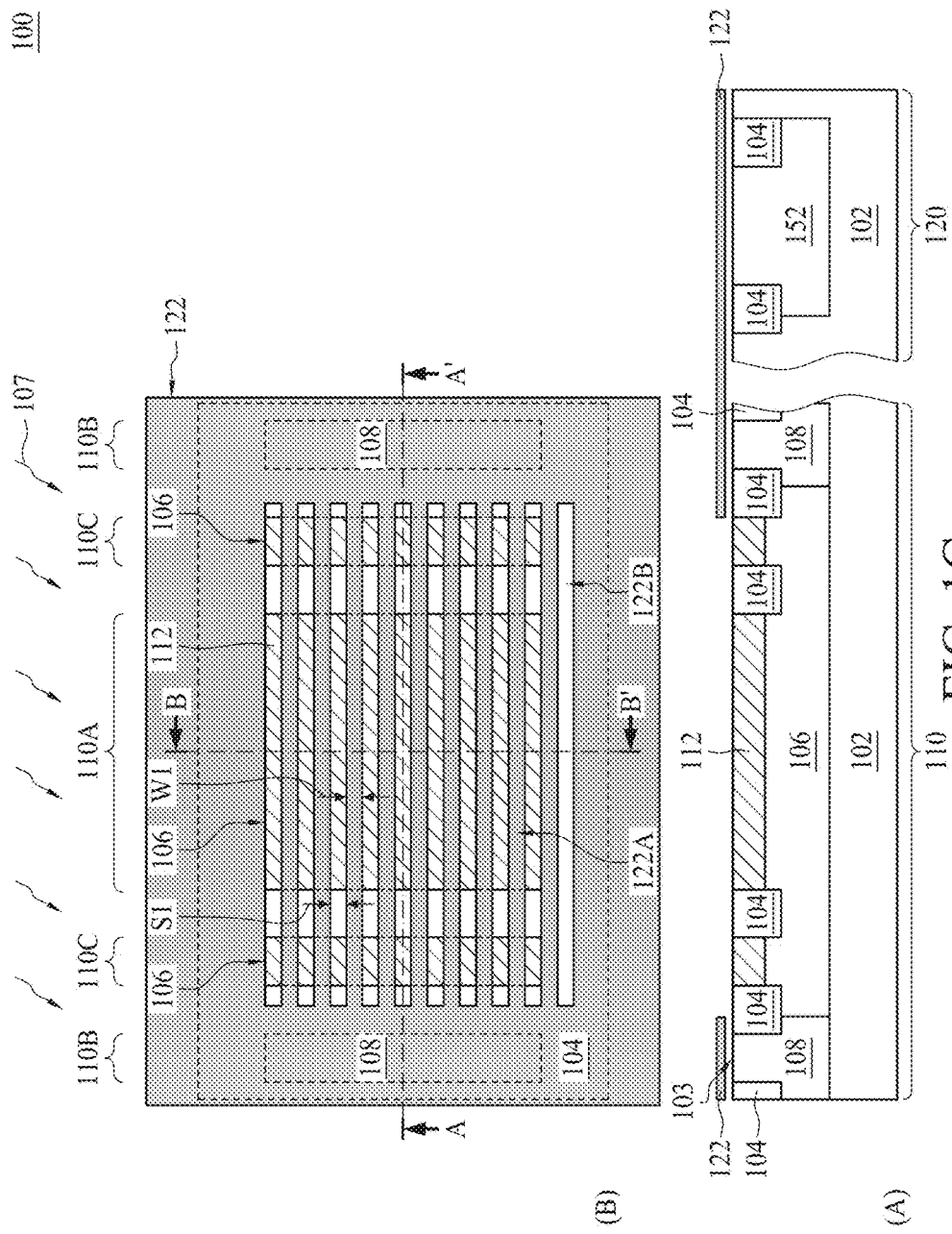

Referring to FIG. 1C, a photomask 122 is positioned over the semiconductor device 100. The photomask 122 is used for patterning the well region 106. In an embodiment, the photomask 122 is configured to partially expose the well region 106 while covering the remaining portion of the semiconductor device 100. For example, the anode zone 110A and the cathode zones 110C are partially exposed while the bulk zones 110B and the transistor region 120 are completely covered. In an embodiment, the photomask 122 includes openings substantially overlapping the well region 106. In an embodiment, the openings of the photomask 122 may be hollow portions or formed of relatively transparent materials. The amount of the well region 106 that is exposed can be controlled through different design parameters of the openings of the photomask 122. In the depicted example, the photomask 122 includes a plurality of strips 122A over the well region 106. The strips 122A act as masks to prevent ions from implanting into the well region 106 and may abut one another if no exposure spacing is present. To conduct ion implantation, strip-like openings 122B are formed between the strips 122A and allow ions to pass through. In an embodiment, the strips 122A are arranged in a parallel fashion. Consequently, the strip-like openings 122B are also formed as parallel strips or slits. In an embodiment, the strip-like openings 122B or the strips 122A run over the isolation structures 104 between the anode zone 110A and the cathode zone 110C. Each of the strips 122A has a width W1. A gap S1 between adjacent thinned strips 122A is defined as the dimension of each of the strip-like openings or slits 122B. In an embodiment, the ratio of the spacing S1 to the width W1. i.e., S1/W1, or the proportion S1:W1, determines an exposure opening ratio (equivalent proportion S1:W1) of the photomask 122. For example, a ratio of 0% (or proportion 0:1) means no opening is present while a ratio of 100% (or S1:W1=1:1) implies a half-opened photomask over the well region 106. In an embodiment, the exposure opening proportion is between about 33.3% (i.e., S1:W1=1:3) and about 300% (i.e., S1:W1=3:1) in order to obtain desirable diffusion outcome given the thermal budget described below. In an embodiment, the strip 122A is seen as a spacing between the slits 122B. In an embodiment, the width W1 of the strips 122A is regarded a spacing width between the slits 122B.

In an embodiment, the exposure opening proportion is defined as a proportion between a summed area of the openings 122B overlapping the exposed well region 106 and a total area of the covering regions 122A overlapping with the well region 106. An area ratio of 0% or area proportion (0:1) means no opening is present while an area ratio of 100% or area proportion (1:1) implies a half-opened photomask over the well region 106. In an embodiment, the area proportion of the openings 122B to the covering regions 122A is between about 1:3 and about 3:1. As different diodes are manufactured with different exposure opening ratios on the same photomask 122, several well regions including the well region 106 may receive different amounts of implantation dopants assuming all well regions have a same area under identical implantation conditions, for example, same implantation dose. Varying doping concentrations in different well regions may be obtained through appropriate smoothing operations to average the doping concentrations in the well regions. Different shapes and numbers of the openings 122B of the photomask 122 are possible and are within the contemplated scope of the present disclosure.

Figure 1D:
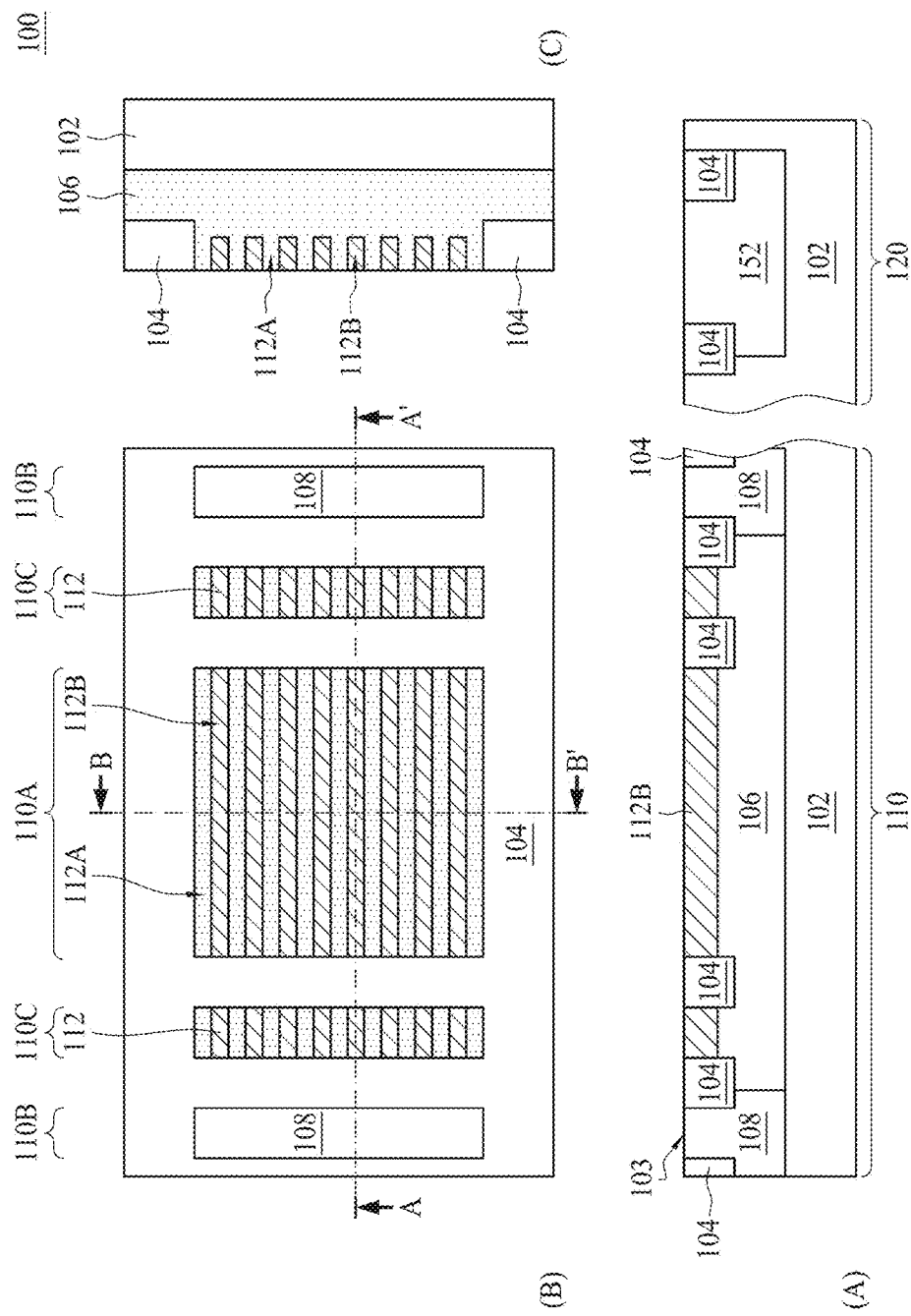

Subsequently, an ion implantation operation 107 is performed on the semiconductor device 100. The semiconductor device 100 after receiving the ion implantation operation 107 is shown in FIG. 1D. Ions are implanted into the well region 106 through the openings 122B of the photomask 122. An implanted first portion 112B (marked in shades) is formed in the well region 106 by the ion implantation operation 107. The first portion 112B substantially follows the pattern of the spacings 122B of the photomask 122. The first portion 112B has a strip-like pattern overlapped with the anode zone 110A and the cathode zones 110C, and the strip-like pattern follows the exposure pattern of the photomask 122. As seen in subplots (B) and (C), a second portion 112A between the strips of the first portion 112B is left undoped in the well region 106. The second portion 112A substantially follows the pattern of the strip structure 122A of the photomask 122. In the depicted example as shown in subplot (A), the first portion 112B has a doping depth less than the depth of the well region 106. In an embodiment, the first portion 112B has a depth less than the depth of the isolation structure 104. In an embodiment, the first portion 112B has a substantially uniform doping profile across each of the strips of the second portion 112A. In an embodiment, the strips of the second portion 112A are substantially void of implanted ions of the first portion 112B as a result of the ion implantation operation 107.

Still referring to FIG. 1D, each of the well regions 106 and 152 may include dopants of a first conductive type (for example, N-type), such as phosphorus or the like. The well region 108 may include dopants of a second conductive type (for example, P-type), such as boron or the like. In some embodiments, the conductive type of the well region 106, 108 or 152 may be identical to or opposite of the conductive type of the substrate 102. For example, the substrate 102 and the well region 108 may be of P-type while the well regions 106 and 152 may be of N-type. In an embodiment, the implanted ions of the ion implantation 107 have the first conductive type or the second conductive type. In an embodiment, the dose of the ion implantation 107 is between about 1E13 atoms/cm$^2$ and about 1E15 atoms/cm$^2$. In an embodiment, the dose of the ion implantation 107 is between about 1E14 atoms/cm$^2$ and about 1E15 atoms/cm$^2$. In an embodiment, the energy power of the ion implantation operation 107 is between about 5 and about 30 Kev for a P-type dopant, and is between about 5 and 50 Kev for an N-type dopant.

The quantity of the implanted ions received by the first portion 112B is determined by the area ratio of the openings 122B to the well region 106 exposed through the upper surface 103 for a given uniform implantation source. A Schottky diode (e.g., the diode region 110) may include a heterojunction constructed by an anode terminal (e.g., the anode zone 110A) formed of a metallic material and a cathode terminal (e.g., the cathode zone 110B) formed of a semiconductor layer (e.g., first doped layer 112 in FIG. 1E) in a well region (e.g., the well region 106). The barrier height of the Schottky diode is determined by both the conductive type and the doping concentration of the semiconductor layer. When ions of a same conductive type are selected for the first portion 112B and the well region 106, such as an N-type dopant, a higher doping concentration leads to a lower barrier height. In contrast, using the implantation ions of opposite conductive types for the first portion 112B and the well region 106 causes a greater barrier height as the doping concentration increases.

Figure 1E:
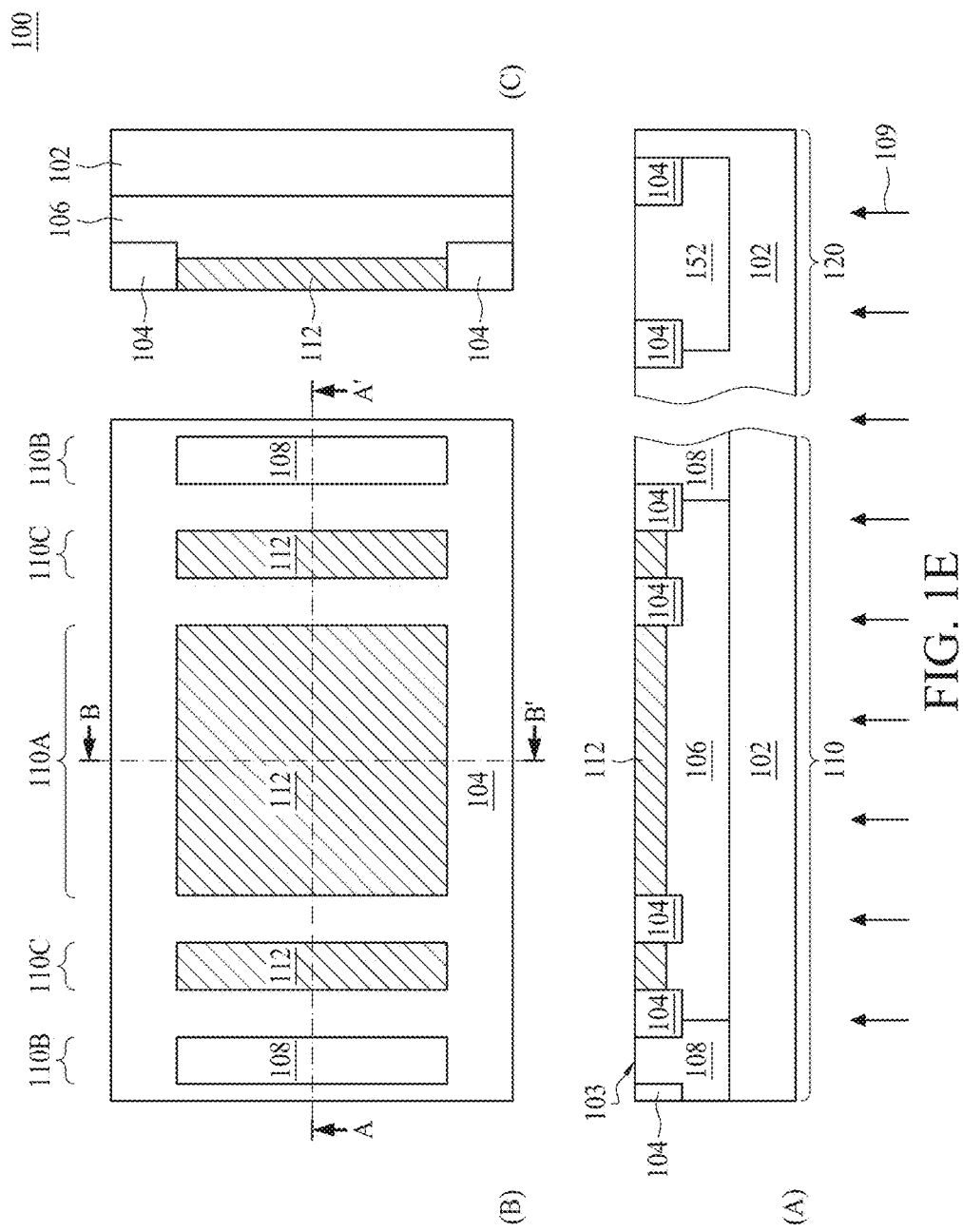

Referring to FIG. 1E, a thermal operation 109 is performed on the substrate 102. The thermal operation 109 may include an annealing operation, such as a furnace anneal, a rapid thermal anneal (RTA) or the like. Through the thermal operation 109, ions in the first portion 112B are driven out and diffuse into the adjacent second portion 112A. The doping concentration in the first portion 112B is decreased along with the ion diffusion, and the doped concentration of the second portion 112A is increased accordingly. Therefore, a contiguous first doped region 112 is formed, across which a substantially uniform doping concentration is achieved due to ion diffusion. In an embodiment, the first doped region 112 is formed on the upper surface 103 of the anode zone 110A and the cathode zones 110C. The eventual diffusion performance of the implanted ions is determined by at least the initial doping concentration of the first portion 112B and the dimensions of the spacings 122B of the photomask 122. The diffused distance of ions may be controlled by the thermal budget of the thermal operation 109 and the dopant species used. In an example, the diffusion distances of the commonly used dopants may be boron>phosphorous>arsenic under a same thermal condition. In an embodiment, the thermal operation 109 has a thermal budget of a heating temperature between about 1000° C. and about 1100° C. for a duration between about 5 seconds and about 20 seconds. In some examples with a strip shape of the spacing 122B, the eventual doping concentration is controlled by the exposure opening ratio S1/W1 in FIG. 1C. In an embodiment, the spacing S1 is no greater than about 0.5 μm.

As discussed previously, the quality of the first doped region 112 is determined by the diffusion performance of the ions between the first portion 112B and the second portion 112A. Thus, it is required to take the diffusion distance into account that is dependent on the thermal budget and the dopant type. Assuming the average ion diffusion distance is L, the maximum length of the width W1 would be designed around 2L such that the ions situated at the edge of the first portion 112B could reach the center of the second portion 112A through diffusion and form a first doped region 112 without dopant-free area. Similarly, the maximum length of the spacing S1 would be around 2L such that the ions driven from the thermal operation 109 could leave the first portion 112B and reach the neighboring strip of the second portion 112A. The first doped region 112 with a substantially uniformly doping profile is obtained accordingly.

In an embodiment which provide a thermal budget permitting an average diffusion distance L for dopants at the edge of the first portion 112B, a range of the exposure opening proportion S1:W1 is between about 33.3% (i.e., S1:W1=1:3) and about 300% (i.e., S1:W1=3:1). In an embodiment, an exposure opening ratio is defined as a ratio of the implanted opening width S1 to the summed width of the width S1 and the non-implanted strip W1, i.e., S1:(S1+W1). In an embodiment, the exposure opening ratio S1:(S1+W1) is determined as between about 25% and about 75% in order to obtain desirable diffusion outcome.

Figure 1F:
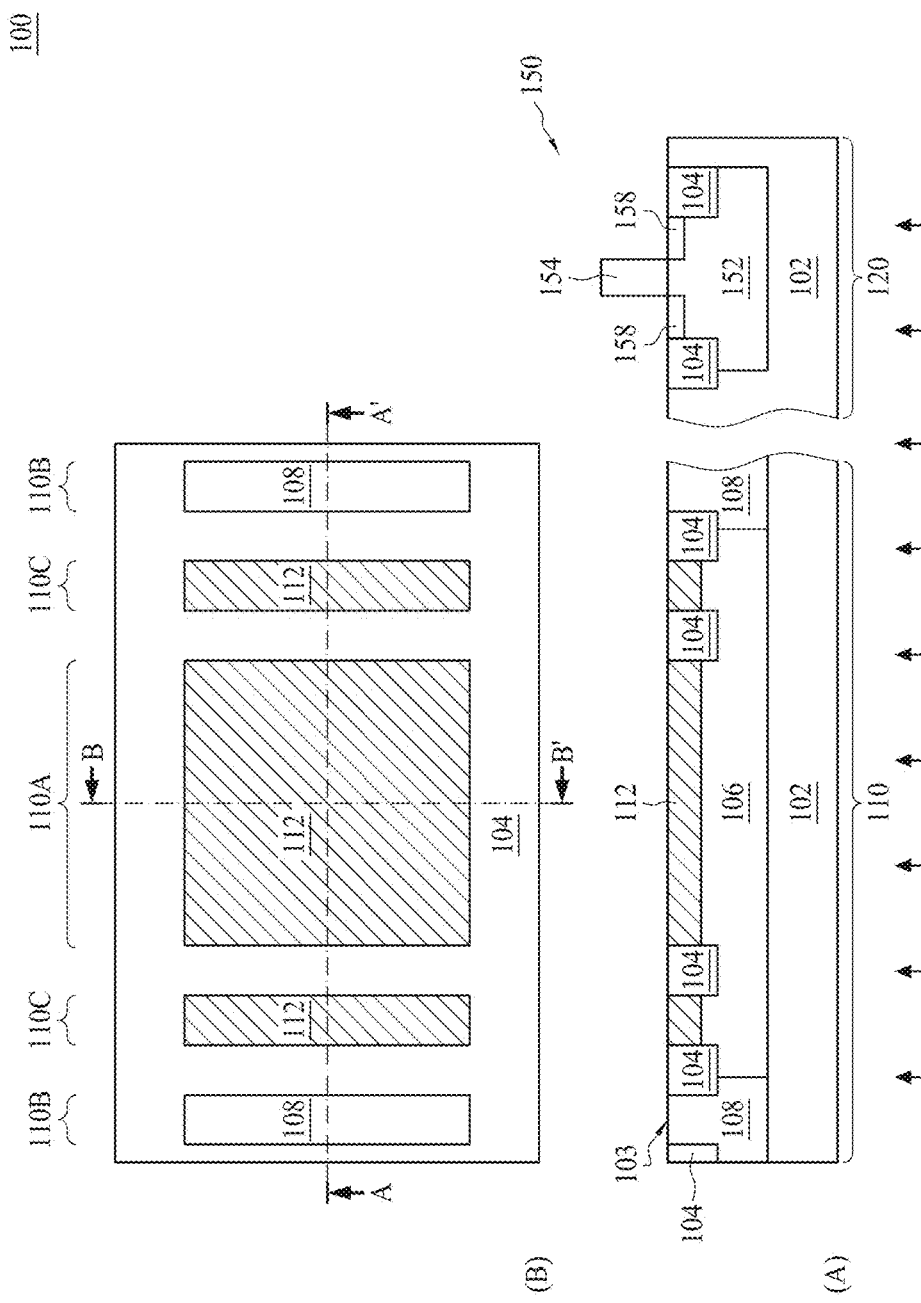
Figure 1G:
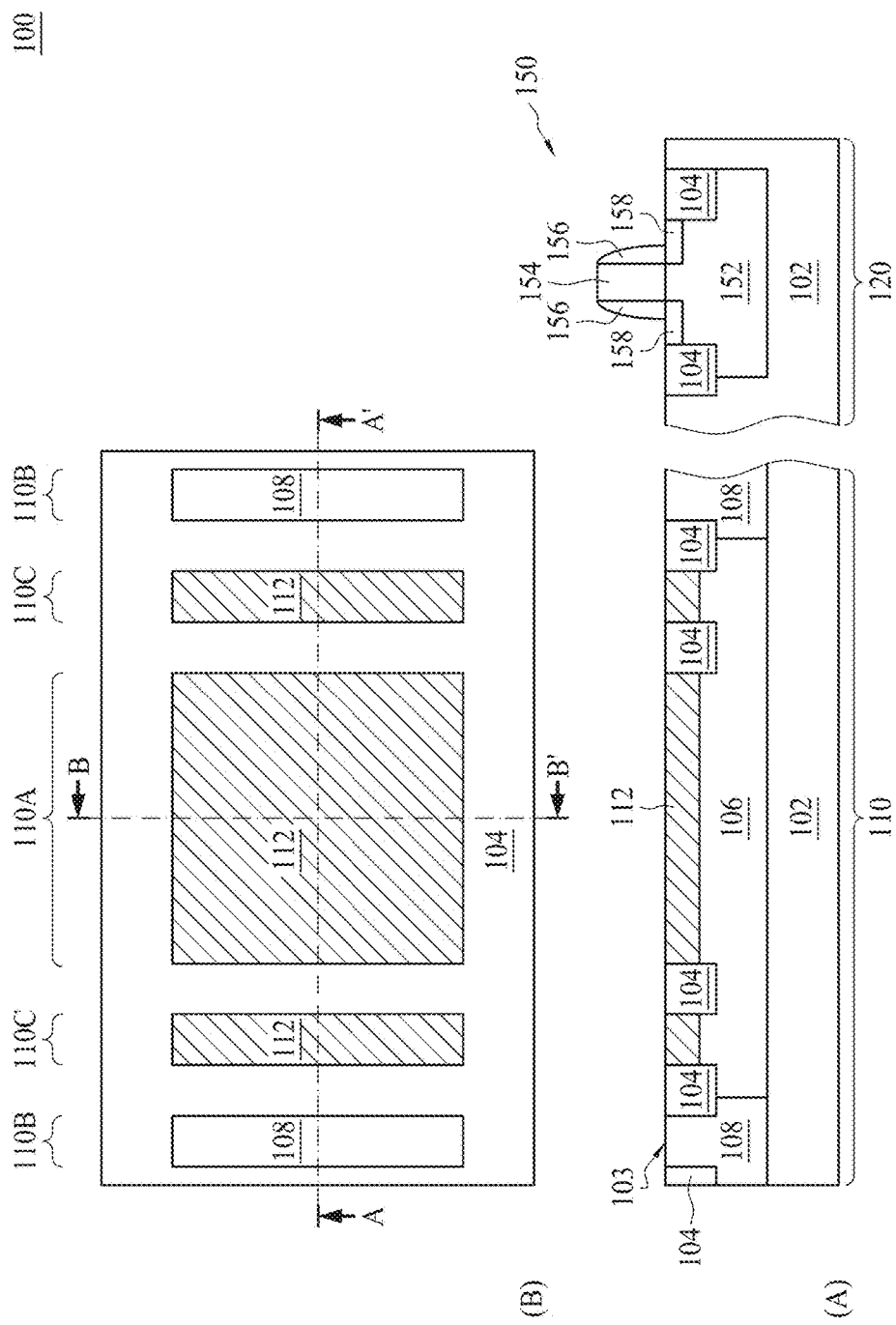

FIGS. 1F and 1G illustrate a forming of transistors in the transistor region 120. In the present embodiment, only one transistor 150 is shown. However, any number of transistors or other active/passive devices are within the contemplated scope of the present disclosure. Referring to FIG. 1F, a gate layer 154 is initially formed on the upper surface 103. The gate layer 154 may comprise conductive materials, such as polysilicon or metallic materials. In some embodiments, the metallic material may include tungsten (W), titanium nitride (TiN), tantalum (Ta), or compounds thereof. Other commonly used metals that could be used in the conductive material include nickel (Ni) and gold (Au). Furthermore, the gate layer 154 may be formed by an operation such as CVD, PVD, sputtering, or the like. In an embodiment, a thermal operation 111 is performed on the substrate 102 to treat the sidewall surface of the gate layer 154. The thermal operation 111 may include an annealing operation, such as a furnace anneal, a rapid thermal anneal (RTA) or the like. The operation parameters of the thermal operation 111 may be similar to those of the thermal operation 109. In an embodiment, in order to treat the sidewall surface of the gate layer 154, the thermal operation 111 has a thermal budget of a heating temperature between about 750° C. and about 900° C. for a duration between about 10 minutes and about 60 minutes.

Next, two lightly doped regions (or lightly doped drains, LDD) 158 are formed in the well region 152 between the gate layer 154 and the isolation structures 104. The lightly doped regions 158 may be formed by using an ion implantation operation similar to the operation 107 while some implantation parameters, such as the doping concentration, may be varied. In an embodiment, the lightly doped regions 158 have a conductive type that is the same as or different from that of the well region 152. In an embodiment, the thermal operation 111 is employed again to treat the lightly doped regions 158 subsequent to the formation of the lightly doped regions 158. The operation parameters of the thermal operation 111 may be similar to those used for the thermal operation 109. In an embodiment, in order to activate the lightly doped regions 158, the thermal operation 111 has a thermal budget of a heating temperature between about 700° C. and about 800° C. for a duration between about 30 minutes and about 90 minutes.

In an embodiment, a gate dielectric layer (not separately shown) is formed between the gate layer 154 and the substrate 102. The gate dielectric layers may be formed of dielectric materials, such as silicon oxide, silicon nitride, silicon oxynitride, high-k dielectric material, or the like. The high-k material may be selected from metal oxides, metal nitrides, metal silicates, transition metal-oxides, transition metal-nitrides, transitional metal-silicates, oxynitride of metals, metal aluminates, zirconium silicate, zirconium aluminate, hafnium oxide, or combinations thereof. The gate dielectric layer may be formed by any suitable method, such as CVD, PVD, ALD, plasma-enhanced CVD (PECVD), high-density plasma CVD (HDPCVD), low-pressure CVD (LPCVD), or the like.

Subsequently, as illustrated in FIG. 1G, spacers 156 are formed on a sidewall of the gate layer 154. In an embodiment, the spacers 156 are formed of a dielectric material such as oxide, oxynitride, nitride, nitrogen-bearing oxide, nitrogen-doped oxide or silicon oxynitride. The spacers 156 may be formed by depositing a blanket dielectric material covering the gate material 154 and the upper surface 103, followed by an etching operation to remove the horizontal portions of the dielectric material.

Figure 1H:
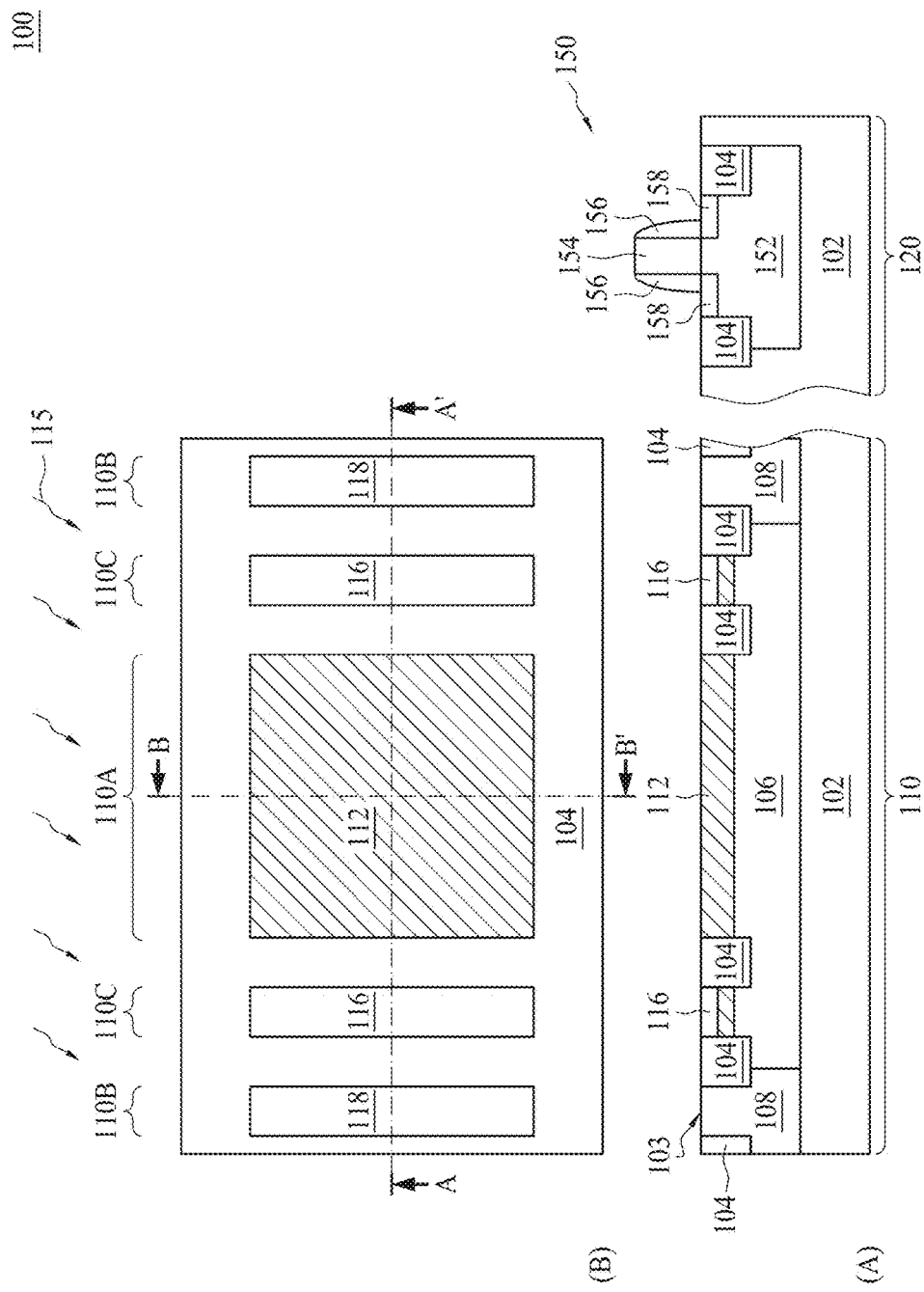

Referring to FIG. 1H, an ion implantation operation 115 is performed on the cathode zones 110C of the diode region 110. In an embodiment, another photomask (not separately shown) is employed to expose only the cathode zones 100C while covering the remaining portions of the semiconductor device 100. Two second doped regions 116 are formed in the corresponding cathode zones 110C accordingly. In an embodiment, the second doped region 116 is used to improve electrical properties of the cathode zones 110C and conductively couples the cathode zones 110C to a cathode terminal. In an embodiment, the ion implantation operation 115 supplies a substantially uniform concentration across each of the cathode zones 110C, e.g., using a photomask with an exposure opening ratio of 100%. The second doped region 116 has a conductive type same as that used in the well region 106, such as an N-type dopant. In an embodiment, the implantation operation 115 of arsenic dopants has a dose between about 1E15 atoms/cm$^2$ and about 6E15 atoms/cm$^2$ with an energy power between about 10 Kev and 30 Kev. In an embodiment, the implantation operation 115 of phosphorous dopants has a doping concentration between about 5E13 atoms/cm$^3$ and about 5E14 atoms/cm$^3$ with an energy power between about 10 Kev and 60 Kev. In an embodiment, the cathode zones 110C receive a thermal operation in order to activate the ions and make the implantation profile more uniform. Such thermal operation may include an annealing operation, such as a furnace anneal, a rapid thermal anneal (RTA) or the like. In an embodiment, the thermal operation 109 is performed after the formation of the second doped regions 116. In an embodiment, the thermal operation 109 is repeated after the second doped regions 116 are completed.

Figure 1I:
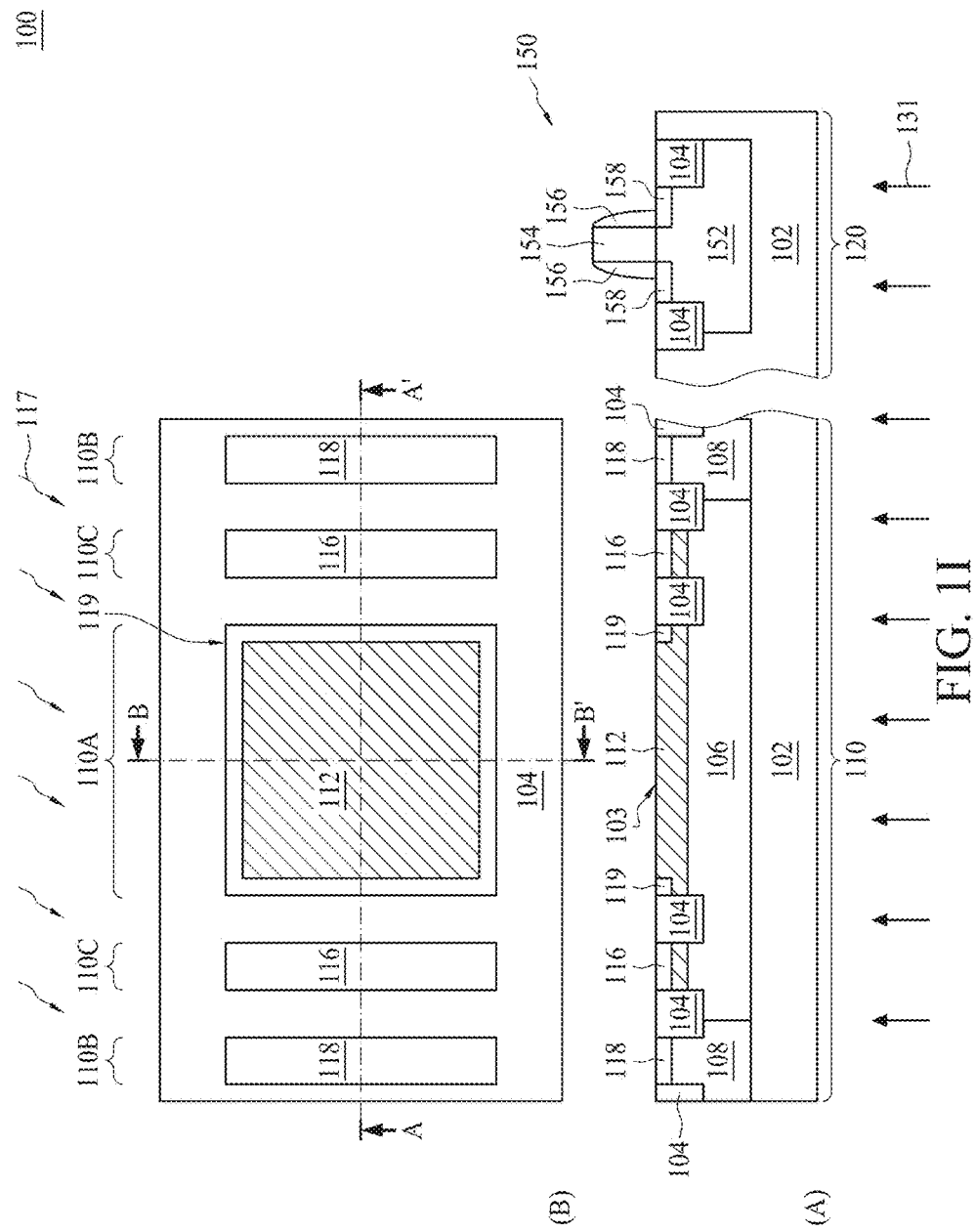

Referring to FIG. 1I, an ion implantation operation 117 is performed on the bulk zones 110C of the diode region 110. In an embodiment, yet another photomask (not separately shown) is employed to expose only the bulk zones 110B while covering the remaining portions of the semiconductor device 100. Two third doped regions 118 are formed on the corresponding bulk zones 110B accordingly. In an embodiment, the third doped region 118 is used to improve electrical properties of the bulk zones 110B and conductively couples the bulk zones 110B to a body terminal. In an embodiment, the ion implantation operation 117 supplies a substantially uniform concentration across each of the bulk zones 110B, e.g., using a photomask with an exposure opening ratio of 100%. In an embodiment, the third doped layer 118 has a conductive type same as that of the well region 108, such as a P-type dopant. In an embodiment, the implantation operation 117 of boron dopants has a dose between about 1E15 atoms/cm$^2$ and about 6E15 atoms/cm$^2$ with an energy power between about 3 Kev and 30 Kev. In an embodiment, the bulk zone 110B receives a thermal operation 131 in order to activate the ions and make the implantation profile more uniform. The thermal operation 131 may include an annealing operation on the substrate 102, such as a furnace anneal, a rapid thermal anneal (RTA) or the like. In an embodiment, in order to activate the third doped region, the thermal operation 131 applied to the entirety of the substrate 102 has a thermal budget of a heating temperature between about 1000° C. and about 1100° C. for a duration between about 5 seconds and about 20 seconds.

In an embodiment, a fourth doped region 119 is formed at a periphery of the anode zone 110A. The fourth doped region 119 may be formed during the formation of the third doped regions 118 (a modification to the photomask may be needed for forming the fourth doped region 119 accompanying the formation of the third doped regions 118). The fourth doped region 119 may be used to reduce the amount of leakage current of the first doped region 112 around the edges. In an embodiment, the fourth doped region 119 is formed on the upper surface 103. In an embodiment, the fourth doped region 119 has a depth less than that of the first doped region 112. In an embodiment, the fourth doped region 119 has a conductive type opposite to the conductive type of the well region 106.

Figure 1J:
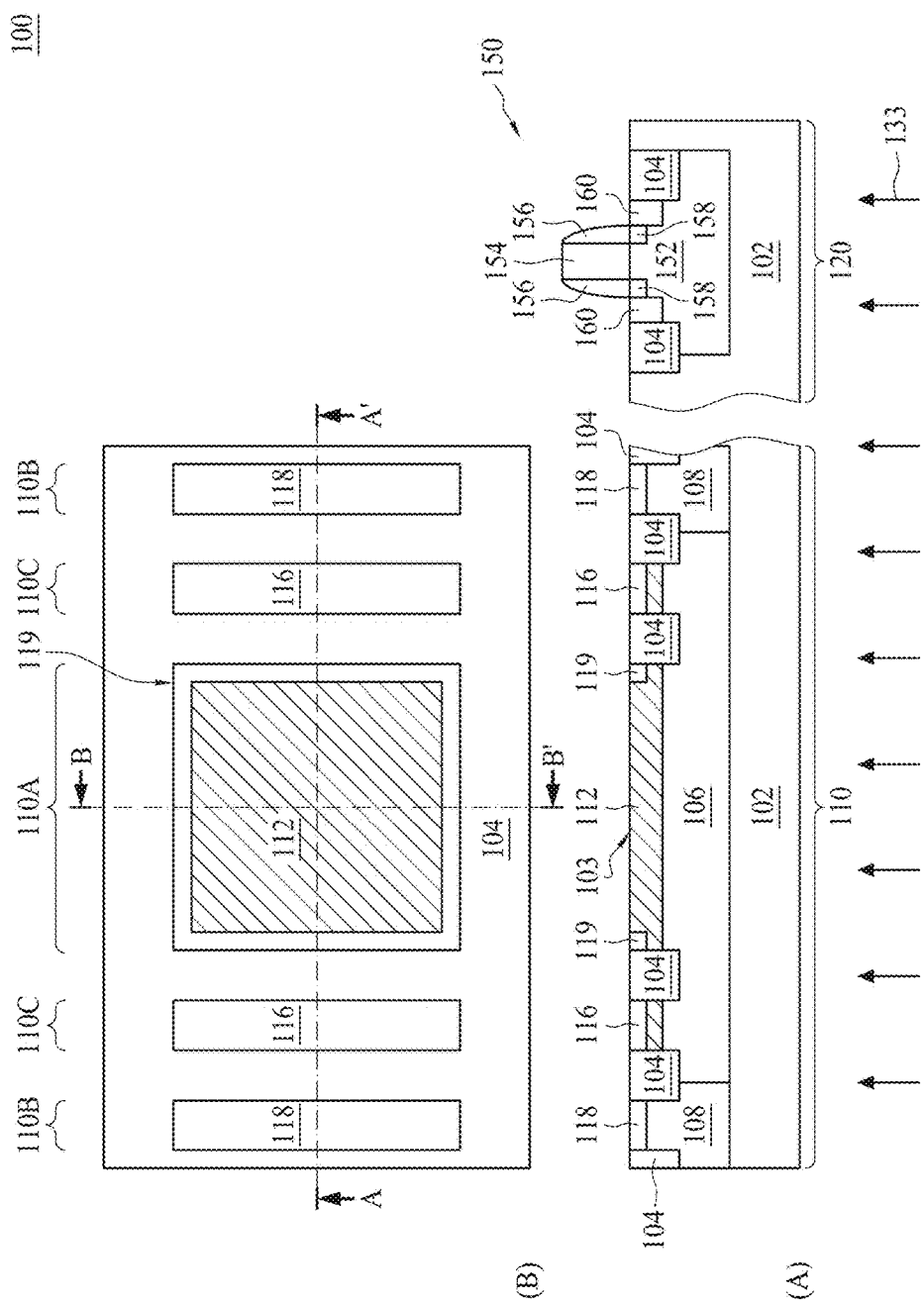

In FIG. 1J, two source/drain regions 160 are formed in the well region 152 between the isolation structures 104 and the gate layer 154. The source/drain regions 160 may be formed by an ion implantation operation. In an embodiment, the source/drain regions 160 are formed with the gate layer 154 and the isolation structures 104 as implantation masks. In some embodiments, the source/drain regions 160 are of a conductive type, such as N-type, opposite to the conductive type of the well region 152. The source/drain regions 160 may be formed with their upper surface substantially level with the upper surface 103. Alternatively, a raised source/drain structure may also be used. In an embodiment, the source/drain regions 160 receive a thermal operation 133 in order to activate the implanted ions and make the implantation profile more uniform. The thermal operation 133 may include an annealing operation on the substrate 102, such as a furnace anneal, a rapid thermal anneal (RTA) or the like. In an embodiment, in order to activate the source/drain regions 160, the thermal operation 133 has a thermal budget of a heating temperature between about 1000° C. and about 1100° C. for a duration between about 5 seconds and about 20 seconds.

As discussed previously, during the manufacturing operations of the transistor 150, one or more thermal operations (e.g., operations 111, 131 and 133) may be utilized to activate the ions of the lightly doped regions 158 and the source/drain regions 160 and achieve better doping profiles. In the meantime, such thermal operations can be simultaneously applied to the first doped region 112, the second doped regions 116 or the third doped regions 118 subsequent to the thermal operation 109. In an embodiment, the first doped region 112, which is formed through ion diffusion between the first portion 112B and the second portion 112A, is obtained through several thermal operations as mentioned above. During the manufacturing procedures of the semiconductor device 100, calculated thermal budget demonstrated in several thermal operations for heating existing features in either the diode region 110 or the transistor region 120 could accumulatively provide the implanted ions in the first portion 112B of the first doped region 112 with sufficient thermal energy to diffuse into its neighboring regions, for example, the second portion 112A of the first doped region 120. As long as the overall thermal budget is met, as previously discussed, extra annealing operations or prolonged annealing duration may not affect the final quality of the first doped region 112. In an embodiment, the thermal operations are conducted through, for example, heating the entirety of the semiconductor device 100 or the substrate 102. Such thermal operation causes most of the doped regions to be heated at the same time. As a result, the performance of the first doped region 112, the second doped regions 116 or the third regions 118 may be improved in an economical manner through the multiple thermal operations.

Figure 1K:
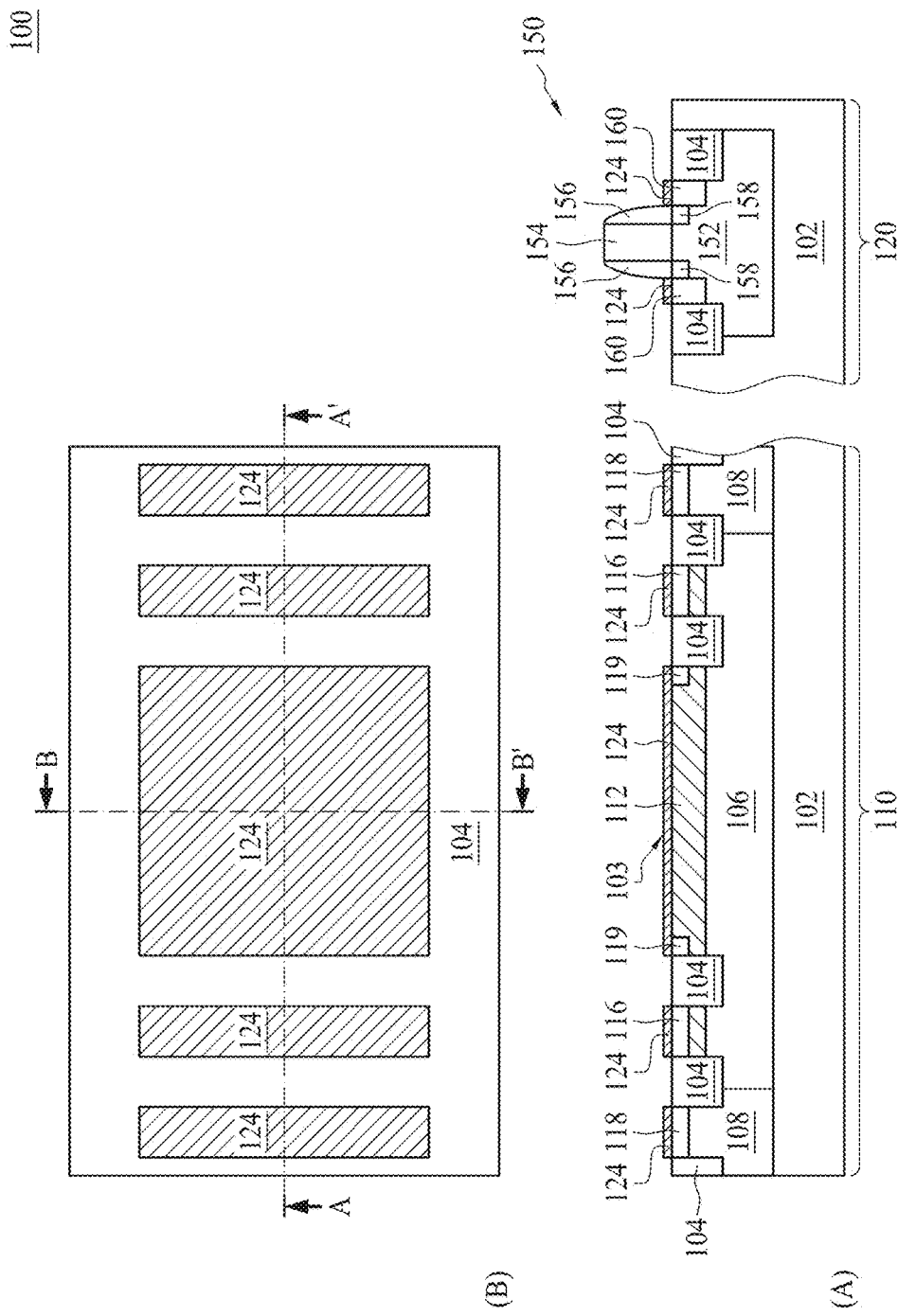

Subsequently, a conductive layer 124 is formed on the diode region 110 and the transistor region 120, as shown in FIG. 1K. Specifically, the conductive layer 124 is formed on the anode zone 110A, the cathode zones 110C and the bulk zone 110B of the diode region 110. The conductive layer 124 is also formed on the source/drain regions 160 of the transistor 150. In an embodiment, the conductive layer 124 is a metal-containing conductive layer, e.g., a silicide layer. In an embodiment, the conductive layer 124 acts as an anode material in the anode zone 110A of the Schottky diode. In an embodiment, the conductive layer 124 abuts the first doped region 112 acting as the semiconductor layer, thereby a Schottky barrier interface is formed between the conductive layer 124 and the first doped region 112. A barrier height is established at the interface accordingly. In an embodiment, the conductive layer 124 is employed to provide a reduced-resistance contact between a subsequently-formed conductive via and underlying layers (such as the second doped regions 116, the third doped regions 118 or the source/drain regions 160).

When a silicide layer is selected as the conductive layer 124, the silicide layers 124 may be formed of tungsten silicide, titanium silicide, cobalt silicide, nickel silicide and the like. Taking tungsten silicide as an example, the silicide layer is formed by reacting tungsten fluoride ($WF_6$) with silane ($SiH_4$). Alternatively, the silicide layer may be formed by depositing a layer of selected metal over the silicon portion of the above-mentioned doped regions, followed by an annealing operation so as to facilitate silicidation of the selected metal. In some embodiments, portions of the metal layer not reacting with the silicon may be removed.

Figure 1L:
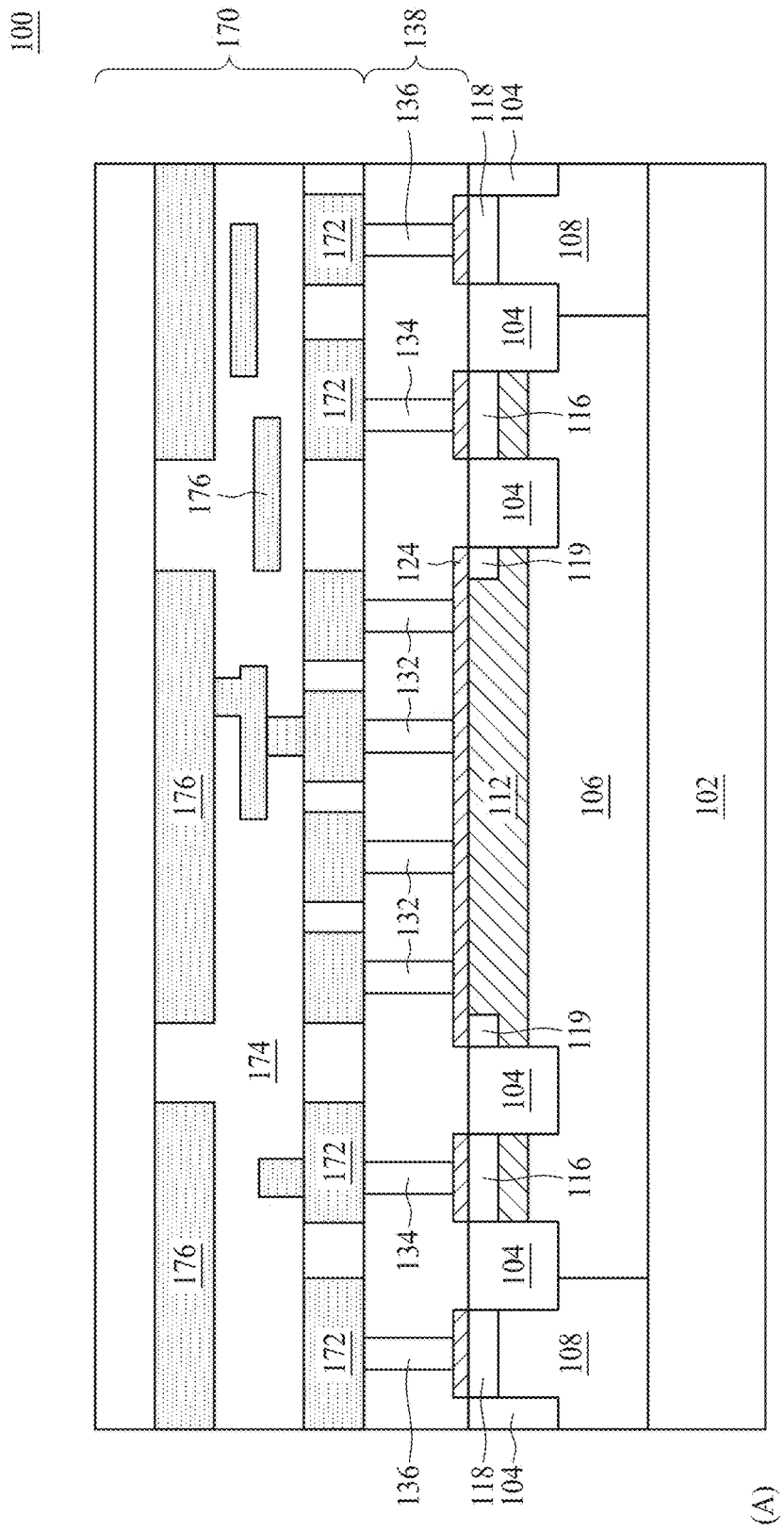

Referring to FIG. 1L, an inter-layer dielectric (ILD) 138 is formed over the substrate 102. The ILD 138 may be formed with a variety of dielectric materials and may be, for example, oxide, oxynitride, silicon nitride, nitrogen-bearing oxide, nitrogen-doped oxide, silicon oxynitride, polymer, or the like. The ILD 138 may formed by any suitable method, such as CVD, PVD, spin coating, or the like.

Several conductive vias are formed in the ILD 138. One or more conductive vias 132 formed over the anode zone 110A electrically couple the conductive layer 124 at the anode zone 110A with an anode terminal (not separately shown). Conductive vias 134 formed over the cathode zones 110C electrically couple the cathode zones 110C with a cathode terminal (not separately shown). Also, conductive vias 136 formed over the bulk zones 110B electrically couple the bulk zones 110B with a body terminal (not separately shown). Additionally, although not demonstrated, each of the source/drain regions 160 is electrically coupled to a corresponding conductive via. The conductive vias 132, 134 and 136 may be formed by forming recesses through the ILD 138 by an etching operation. A conductive material may be filled into the recesses to electrically connect the underlying structures (e.g., doped regions 112, 116, 118 or 160). The conductive material of the conductive vias 132, 134 and 136 may include, but is not limited to, titanium, tantalum, titanium nitride, tantalum nitride, copper, copper alloys, nickel, tin, gold, or combinations thereof.

Once the conductive vias 132, 134 and 136 are in place, several contact pads 172 are formed thereon. Each of the contact pads 172 may have a width larger than the corresponding conductive vias 132, 134 and 136. In some embodiments, the contact pads 172 are disposed over the ILD 138. Subsequently, an interconnect structure 170 is formed over the ILD 138 and the contact pads 172. The interconnect structure 170 is configured to electrically couple the substrate 102 with overlaying features through the contact pads 172. The interconnect structure 170 may include multiple metal layers 176. Each of the metal layers 176 may include horizontal conductive wires and vertical metal vias where the horizontal metal lines are electrically coupled to adjacent overlaying or underlying horizontal metal lines through at least one vertical metal via. The metal layers 176 may include conductive materials such as nickel, tin, gold, silver, alloys or combinations thereof.

The metal layers 176 are electrically insulated from other components. The insulation may be achieved by insulating materials, such as a dielectric 174. The dielectric 174 may be formed of oxides, such as un-doped Silicate Glass (USG), Fluorinated Silicate Glass (FSG), silicon oxide, silicon nitride, silicon oxynitride, low-k dielectric materials, or the like.

Figure 2A:
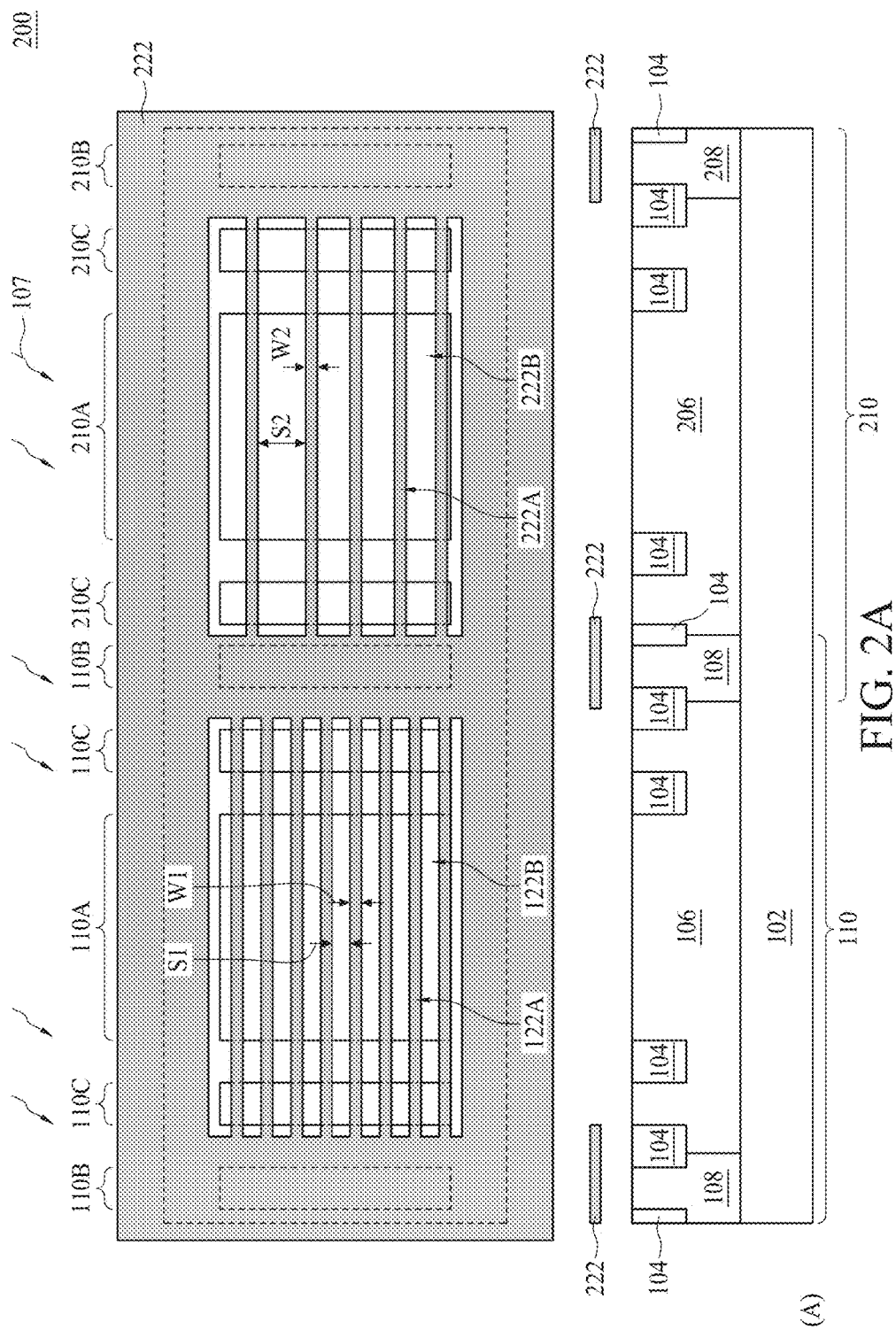
FIGS. 2A through 2C are schematic top views of intermediate stages of a method of manufacturing a semiconductor device, in accordance with some embodiments.
Figure 2B:
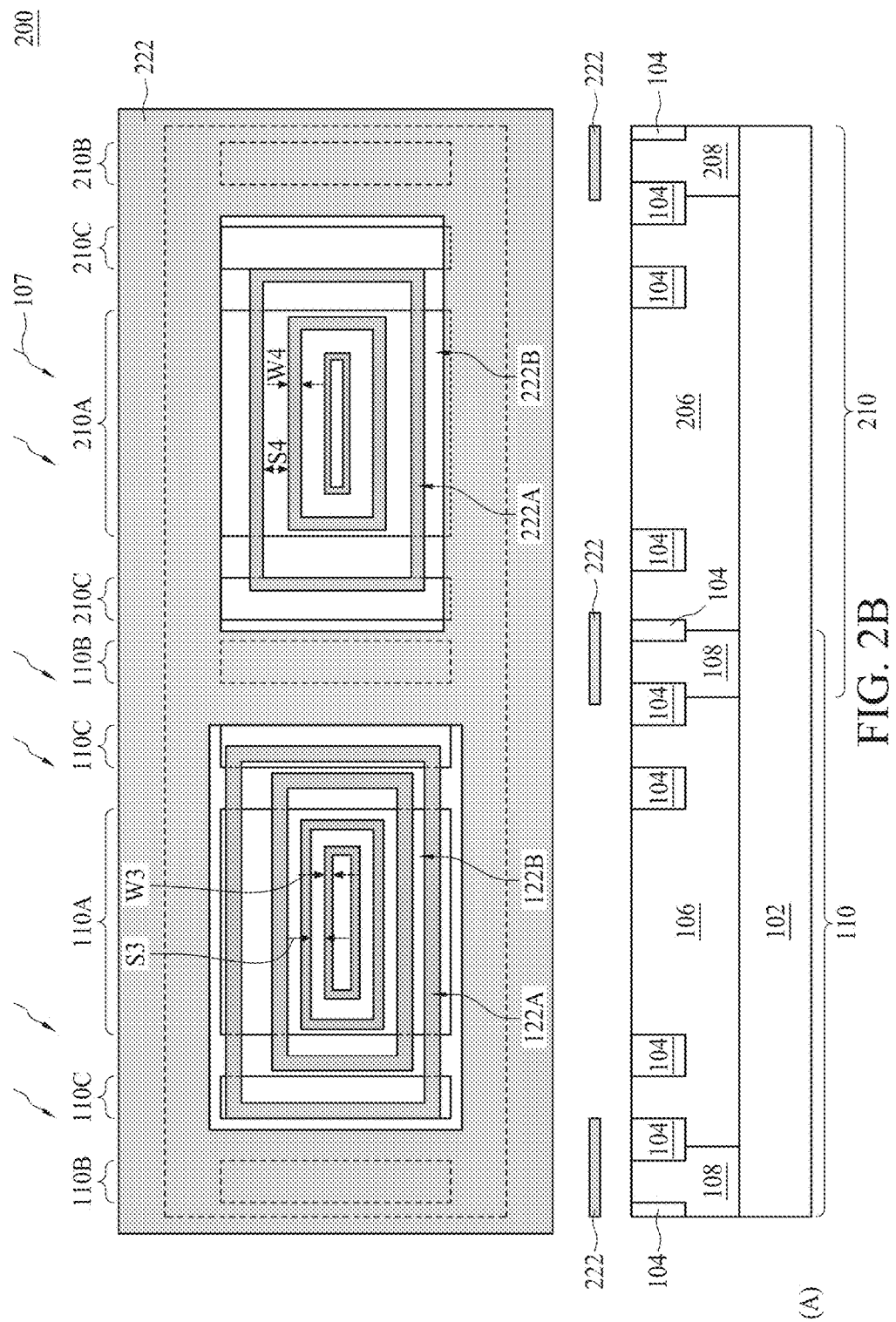
Figure 2C:
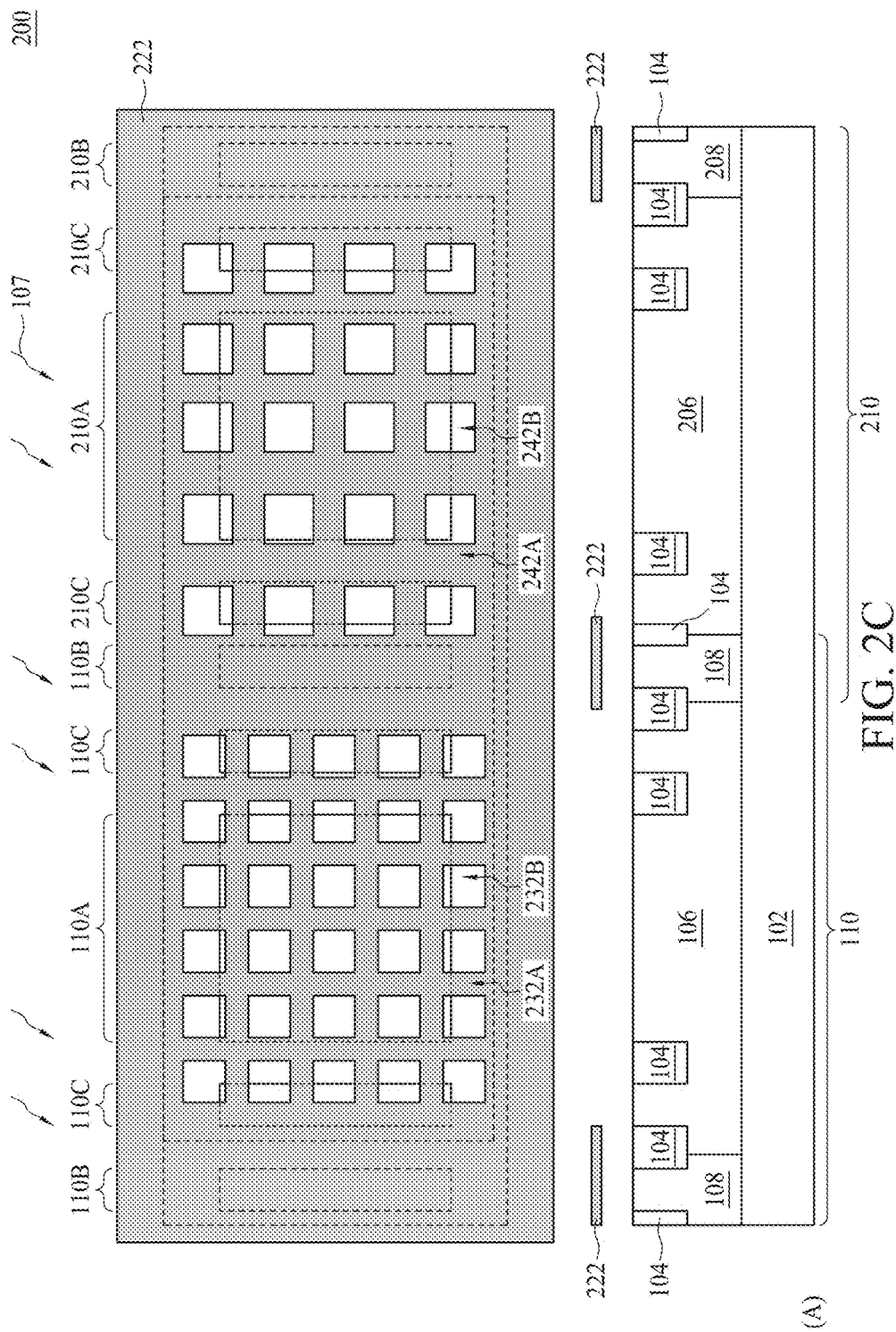

FIGS. 2A through 2C are schematic top views of intermediate stages of a method of manufacturing a semiconductor device 200, in accordance with some embodiments. Some features in FIGS. 2A through 2C that share labels with reference numerals in FIGS. 1A through 1L indicate the features are similar in materials or manufacturing operations. Referring to FIG. 2A, the semiconductor device 200 shown in subplots (A) and (B) is similar to the semiconductor device 100 shown in FIG. 1C, except that the semiconductor device 200 further includes a diode region 210 adjacent to or away from (not shown) the diode region 110. The diode region 210 includes a well region 206 abutting the diode region 110 through the well region 108. Further, the diode region 210 includes another well region 208 in the semiconductor 102 on a side of the well region 206 opposite the well region 108. Like the diode region 110, the diode region 210 includes an anode zone 210A and two cathode zones 210C in the well region 206, and a bulk zone 210B in the well region 208. A photomask 222 is used to expose both of the well regions 106 and 206. In an embodiment, the photomask 222 includes a first exposure opening ratio pattern and a second exposure opening ratio pattern. The first exposure opening ratio pattern includes the first plurality of strips 122A over the well region 106 and openings 122B between the strips 122A. A first exposure ratio is determined by the ratio of the width of the strip 122A and the width of the opening 122B. The second exposure opening ratio pattern includes the second plurality of strips 222A disposed over the well region 206 and openings 222B between the strips 222A that partially expose the well region 206. A second exposure ratio is determined by the ratio of the width of the strip 222A and the width of the opening 222B.

In an embodiment, an ion implantation operation 107 similar to that used in FIG. 1C is performed on the semiconductor device 200 across the diode regions 110 and 210. In some embodiments, the manufacturing operations for the diode regions 110 as illustrated in FIGS. 1A through 1L are similarly applied to the diode region 210 of the semiconductor device 200.

In an embodiment, the first photomask 222 includes at least two exposure opening proportions for the well regions 106 and 206. For example, for a slit-shaped structure in the exposure opening design, the exposure opening proportions for the well regions 106 and 206 can be defined as S1/W1 and S2/W2, respectively. Through appropriate setting of the opening proportions, the semiconductor device 200 can have at least two diode devices on a wafer that have different barrier heights by using only a single photomask and a single ion implantation operation.

Referring to FIG. 2B, a different photomask 222 configuration is shown with different opening shapes. The photomask 222 has a first exposure opening ratio pattern and a second exposure opening ratio pattern that include a plurality of concentric rectangular rings 122A and 222A over the well regions 106 and 206, respectively. Spacings 122B and 222B are formed to expose the respective well regions 106 and 206. The exposure opening proportion can be defined as a ratio of the area of the openings 122B (222B) overlapping the exposed well region 106 to a total area of the rectangular rings 122A (222A) overlapping with the well region 106 (206). Alternatively, assume each of the concentric rectangles has a same side width W3 or W4, and a spacing S3 or S4 is defined as a gap between two parallel sides of adjacent rectangles. The line widths and the spacings of the concentric rectangular concentric rectangles 122A or 222A can be tuned to control the opening ratio S3/W3 or S4/W4. Referring FIGS. 1D, 2A and 2B, a concentric photomask exposure opening design may help formation of a concentric shape of the first portion 112B in the first doped region 112. The second portion 112A can receive diffused ions of the surrounding doped portion 112B from both of the vertical and horizontal directions, rather than from only the vertical directions of the strip-like doped region 112B (demonstrated in FIG. 1D). In an embodiment, a single photomask may include different exposure opening shapes for different well regions on a same semiconductor device, a same wafer or chip.

Referring to FIG. 2C, the photomask 220 is configured with another configuration of opening shapes. The photomask 220 has a first exposure opening ratio pattern and a second exposure opening ratio pattern that include grids 122A and 222A over the well regions 106 and 206, respectively. An array of rectangular spacings 122B and 222B is formed accordingly to expose the respective well regions 106 and 206. The exposure opening proportions can be defined as a ratio between an area of the openings 122B (222B) overlapping the exposed well region 206 and a total area of the grid 232A (242A) overlapping with the well region 106 (206). The grid widths and the dimensions of the hollow rectangles 122B and 222B can be tuned to control their exposure opening ratios. In an embodiment, the spacing between the openings 232B (i.e., the width of a grid bar 232A) in the diode region 110 is less than the spacing between the openings 242B (i.e., the width of a grid bar 242A) in the diode region 210. Referring FIGS. 1D, 2A and 2C, a grid-like photomask exposure opening design may help formation of a grid doped region in the first portion 112B. The second portion 112A can receive diffused ions of the surrounding doped portion 112B from both of the vertical and horizontal directions, rather than from only the vertical directions of the strip-like doped region 112B.

Figure 3:
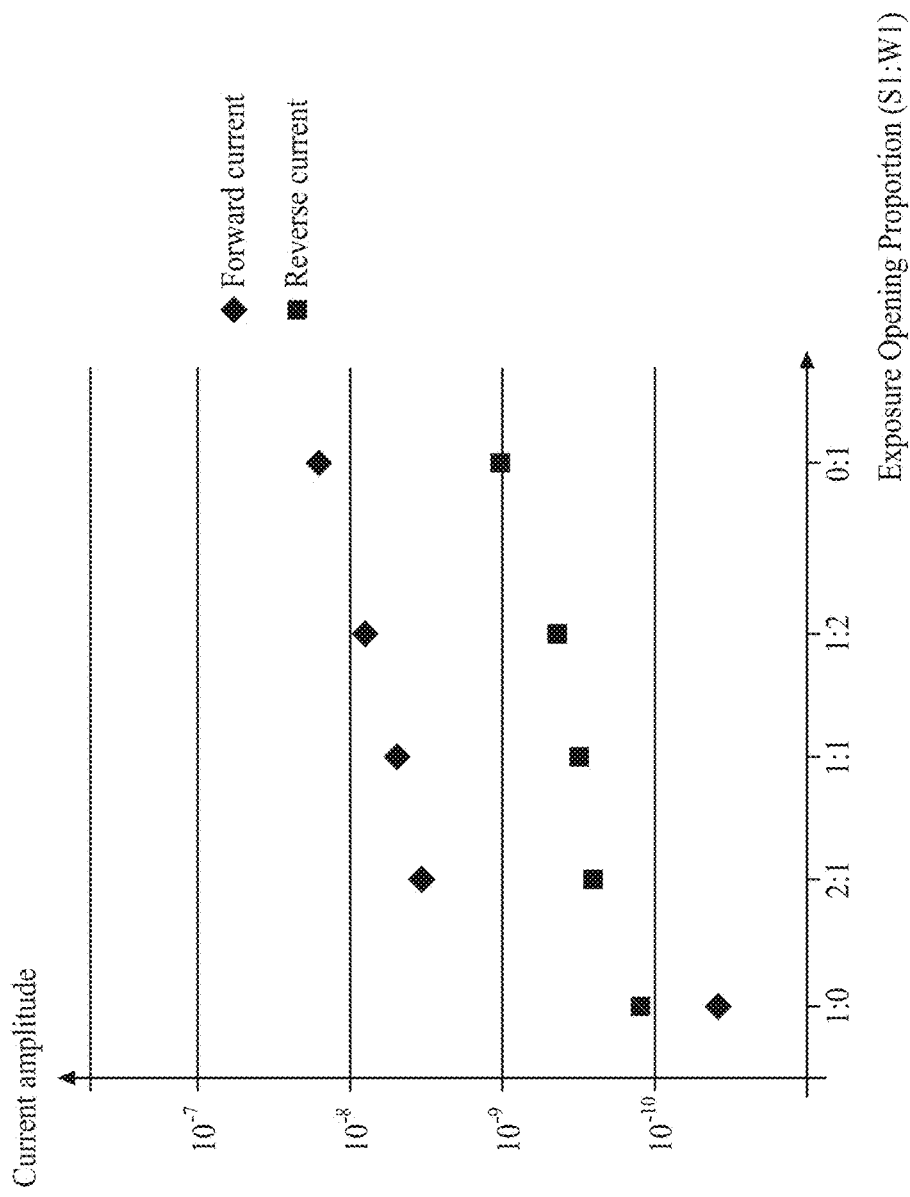
FIG. 3 is a chart showing the performance comparison for the semiconductor device in FIG. 1, in accordance with some embodiments.

FIG. 3 is a chart showing a performance comparison for the semiconductor device 100 in FIG. 1, in accordance with some embodiments. The current values under different photomask exposure opening proportions are illustrated. The conductive type of the semiconductor layer (e.g., first doped region 112 in FIG. 1D) in a diode region is set as different from that of the well region (e.g., the well region 106 in FIG. 1D). A strip-like opening design as shown in FIG. 1C is employed in FIG. 3. Measurements are taken under the forward biasing of about 0.15 volts and reverse biasing of about 2.0 volts for the forward current and reverse current measurement, respectively. FIG. 3 shows that as the photomask has a higher exposure opening proportion, the Schottky barrier height is increased, therefore a lower forward current is reached. This trend can also be observed in photomask exposure opening proportion cases of 2:1, 1:1 and 1:2 where under the same doping intensity and bias, diodes with smaller opening proportions, i.e., receiving less dopants as a whole, generates greater forward current because the Schottky barrier is less high. As discussed previously, when the conductive types of the semiconductor layer and the well region are different, a higher doping concentration will lead to a higher barrier height. In other words, a lower conduction current is thus obtained. The measurement result shows that as the well region is exposed with a fully-opened proportion of 1:0, both the forward current and the reverse current are minimal compared to other cases with lower opening proportions (e.g., between 2:1 and 0:1). The measurement result verifies that an opening proportion-tunable photomask as proposed can help formation of multiple diodes in a same wafer using a same hard mask Different effective doping concentrations in different diode regions are obtained through one or more subsequent thermal operations. As a result, the manufacturing cost and the number of photomasks for a variety of diodes with different barrier heights can be kept as minimal as possible.

The present disclosure provides a method of manufacturing a Schottky diode. A substrate is provided. A first well region of a first conductive type is formed in the substrate. A first ion implantation of a second conductive type is performed on a first portion of the first well region while keeping a second portion of the first well region from being implanted. A first doped region is formed by heating the substrate to cause dopant diffusion between the first portion and the second portion. A metal-containing layer is formed on the first doped region to obtain a Schottky barrier interface.

The present disclosure provides a method of manufacturing a semiconductor device. A substrate is provided. A first well region and a second well region are formed in the substrate. The substrate is patterned by a photomask comprising a first exposure opening ratio pattern corresponding to the first well region and a second exposure opening ratio pattern corresponding to the second well region. An ion implantation is performed through the photomask with a single implantation dose over the first well region and the second well region. The substrate is heated after the ion implantation. A conductive layer is formed on the first well region and the second well region to obtain a Schottky barrier interface.

The present disclosure provides a method of manufacturing a semiconductor device. A substrate is provided. A first well region and a second well region are formed in the substrate. An ion implantation is performed on a first portion of the first well region and a first portion of the second well region while keeping a second portion of the first well region and a second portion of the second well region from being implanted, where an area ratio of the first portion to the second portion of the first well region is different from an area ratio of the first portion to the second portion of the second doped region. The substrate is heated and a metal-containing layer is formed on the first well region and the second well region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a Schottky diode, comprising:
   providing a substrate;
   forming a first well region of a first conductive type in the substrate;
   performing a first ion implantation of a second conductive type on a first portion of the first well region while keeping a second portion of the first well region from being implanted;
   forming a first doped region by heating the substrate to cause dopant diffusion between the first portion and the second portion; and
   forming a metal-containing layer on the first doped region to obtain a Schottky barrier interface.

2. The method according to claim 1, further comprising forming an isolation structure in the substrate, the isolation structure at least surrounding the first well region from a top view perspective.

3. The method according to claim 1, wherein the first conductive type is different from the second conductive type.

4. The method according to claim 1, wherein the first well region comprises an anode zone and a cathode zone, and each of the anode zone and the cathode zone overlaps with the first doped region.

5. The method according to claim 4, further comprising forming a second doped region disposed in the cathode zone and exposed from an upper surface of the substrate.

6. The method according to claim 4, further comprising forming a third doped region at a periphery of the anode zone on an upper surface of the substrate with a conductive type different from that of the first well region.

7. The method according to claim 6, wherein the heating the substrate comprises a first anneal operation after the first ion implantation and prior to the forming the third doped region.

8. The method according to claim 1, further comprising:
   forming a gate layer on the substrate;
   forming a lightly doped region (LDD) in the substrate adjacent to the gate layer; and
   heating the substrate after forming the gate and the LDD by a second anneal operation.

9. The method according to claim 1, further comprising disposing a photomask over the substrate, the photomask having a pattern exposing the first portion while covering the second portion.

10. The method according to claim 9, wherein the pattern comprises a plurality of slits.

11. A method of manufacturing a semiconductor device, comprising:
    providing a substrate;
    forming a first well region and a second well region in the substrate;
    patterning the substrate by a photomask comprising a first exposure opening ratio pattern corresponding to the first well region and a second exposure opening ratio pattern corresponding to the second well region;
    performing an ion implantation with a single implantation dose over the first well region and the second well region through the photomask;
    heating the substrate after the ion implantation; and
    forming a conductive layer on the first well region and the second well region to obtain a Schottky barrier interface.

12. The method according to claim 11, wherein the first exposure opening ratio pattern comprises a first exposure opening ratio by having a first plurality of slits exposing a first portion of the first well region while covering a second portion of the first well region, and the second exposure opening ratio pattern comprises a second exposure opening ratio by having a second plurality of slits exposing a first portion of the second well region while covering a second portion of the second well region, the first exposure opening ratio being different from the second exposure opening ratio.

13. The method according to claim 12, wherein the first plurality of slits comprising a first spacing width different from a second spacing width of the second plurality of slits.

14. The method according to claim 13, wherein a ratio between a spacing of one of the first plurality of slits and the first spacing width is from about 1:3 to about 3:1.

15. The method according to claim 11, wherein the first exposure opening ratio pattern comprises a plurality of concentric rectangles.

16. The method according to claim 11, wherein the heating the substrate comprises:
    performing a first anneal operation after the ion implantation; and
    performing a second anneal operation before the forming the conductive layer.

17. The method according to claim 11, wherein the single implantation dose is between about 1E13 atoms/cm$^2$ and about 1E15 atoms/cm$^2$.

18. A method of manufacturing a semiconductor device, comprising:
    providing a substrate;
    forming a first well region and a second well region in the substrate;
    performing an ion implantation on a first portion of the first well region and a first portion of the second well region while keeping a second portion of the first well region and a second portion of the second well region from being implanted, an area ratio of the first portion to the second portion of the first well region being different from an area ratio of the first portion to the second portion of the second well region;
    heating the substrate; and
    forming a metal-containing layer on the first well region and the second well region.

19. The method according to claim 18, wherein performing an ion implantation comprises disposing a photomask over the substrate, the photomask having a first plurality of openings exposing the first portion of the first well region and a second plurality of openings exposing the first portion of the second well region.

20. The method according to claim 19, wherein one of the first plurality of openings and the second plurality of openings comprise a grid pattern.

* * * * *